US 6,537,876 B2

(12) United States Patent
Chung et al.

(10) Patent No.: US 6,537,876 B2
(45) Date of Patent: Mar. 25, 2003

(54) METHOD OF MANUFACTURING A SEMICONDUCTOR CAPACITOR HAVING A HEMISPHERICAL GRAIN LAYER USING A DRY CLEANING PROCESS

(75) Inventors: Seung-pil Chung, Seoul (KR); Kyu-hwan Chang, Hwasung-gun (KR); Young-min Kwon, Suwon (KR); Sang-lock Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/799,033

(22) Filed: Mar. 6, 2001

(65) Prior Publication Data

US 2001/0021565 A1 Sep. 13, 2001

(30) Foreign Application Priority Data

Mar. 7, 2000 (KR) .............................. 00-11236

(51) Int. Cl.⁷ ...................... H01L 21/8242; H01L 21/20
(52) U.S. Cl. ...................... 438/255; 438/398; 438/723; 438/906; 438/964
(58) Field of Search ................. 438/255, 398, 438/723, 906, 964, FOR 220, FOR 346, FOR 393, FOR 448, FOR 488

(56) References Cited

U.S. PATENT DOCUMENTS

| 5,328,558 | A | | 7/1994 | Kawamura |
| 5,403,436 | A | | 4/1995 | Fujimura et al. |
| 5,620,559 | A | | 4/1997 | Kikuchi |
| 5,975,098 | A | * | 11/1999 | Yoshitani et al. ........... 134/148 |
| 6,013,555 | A | * | 1/2000 | Yew et al. .................. 438/253 |
| 6,066,529 | A | * | 5/2000 | Lin et al. ................... 438/171 |
| 6,149,829 | A | * | 11/2000 | Takamatsu et al. ........... 216/67 |
| 6,211,010 | B1 | * | 4/2001 | Lee et al. ................... 438/255 |
| 6,295,998 | B1 | * | 10/2001 | Kudelka et al. ............. 134/1.3 |
| 6,313,042 | B1 | * | 11/2001 | Cohen et al. ............... 438/655 |
| 6,333,227 | B1 | * | 12/2001 | Kim et al. .................. 257/308 |

FOREIGN PATENT DOCUMENTS

| EP | 00801421 A1 | * | 10/1997 | ....... H01L/21/3205 |
| JP | 04096226 A | * | 3/1992 | ........... H01L/21/30 |
| JP | 04336426 A | * | 11/1992 | ......... H01L/21/302 |
| KR | 1991-016065 | | 9/1991 | |
| KR | 1999-0060901 | | 7/1999 | |
| KR | 10-0263404 | | 5/2000 | |

* cited by examiner

Primary Examiner—Wael Fahmy
Assistant Examiner—Michelle Estrada
(74) Attorney, Agent, or Firm—Volentine Francos, PLLC (57) ABSTRACT

A method of manufacturing a semiconductor device having a hemispherical grain (HSG) layer employs a dry cleaning process. A polysilicon layer is formed on a specific material layer on a semiconductor substrate. Next, a polysilicon pattern, at least a portion of which is exposed, is formed by etching the polysilicon layer. The exposed surface of the polysilicon pattern is then dry cleaned by supplying hydrogen in a plasma state and a fluorine-based gas toward the exposed surface. The exposed surface of the polysilicon pattern may also be wet cleaned before being dry cleaned to wash away pollutants which may have been left thereon. An HSG layer is then formed on the cleaned surface of the polysilicon pattern. After the HSG layer is formed, the surface of the HSG layer may be dry cleaned again by supplying hydrogen in a plasma state and a fluorine-based gas toward the surface of the HSG layer. The surface of the HSG layer may also be further wet cleaned before being dry cleaned. Accordingly, the HSG layer is effectively cleaned without damaging or contaminating the HSG layer, thereby improving the reliability of the semiconductor device.

21 Claims, 7 Drawing Sheets

METHOD OF MANUFACTURING A SEMICONDUCTOR CAPACITOR HAVING A HEMISPHERICAL GRAIN LAYER USING A DRY CLEANING PROCESS

BACKGROUND OF THE INVENTION

1. Field of the Invention

The present invention relates to a method of manufacturing a semiconductor device. More particularly, the present invention relates to a method of manufacturing a semiconductor capacitor having a hemispherical grain (HSG) layer.

2. Description of the Related Art

As semiconductor devices such as DRAMs have become more highly integrated, the area available in the DRAM for a capacitor used for storing data has gradually become smaller while the capacitance requirements have increased. Therefore, various ways have been studied to realize a capacitor having a large capacitance in a small area.

For instance, ways to maximize the surface area of a capacitor within a given space have been studied as means for counteracting the reduction in storage capacitance that would otherwise accompany a reduction in the overall size of the capacitor. These studies include a method of forming a hemispherical grain (HSG) layer on a surface of a storage electrode of the capacitor during its manufacture, to increase the effective surface area of the capacitor.

The conventional process of manufacturing a capacitor having an HSG layer will be briefly described. First, a contact hole is formed in an insulating layer disposed on a semiconductor substrate. The contact hole will be used to connect the capacitor to an active region of the semiconductor substrate. Amorphous silicon is then deposited over the entire surface of the resultant structure. Then, a storage electrode pattern of the capacitor is formed from the amorphous silicon using a well-known photo etching process. Subsequently, an HSG layer is formed by depositing seed particles on the exposed surface of the storage electrode pattern, and controlling the temperature of the seed particles to thereby grow the particles at the surface of the storage electrode pattern, whereby the effective surface area of the storage electrode pattern is increased. Next, a dielectric layer is formed on the HSG layer, and material is deposited and patterned on the dielectric to form a plate serving as the upper electrode of the capacitor.

Not only is the process of forming the HSG layer very complicated, but the growth of the HSG seed layer is much affected by the condition of the exposed surface of the storage electrode pattern. Accordingly, in the prior art, the exposed surface of the storage electrode pattern is cleaned by a wet cleaning process before the HSG layer is formed, to eliminate etching residue, particles, and organic pollutants that remain after the etching process for forming the storage electrode pattern is performed. A mixture of a standard cleaning solution #1 (SC-1) developed by the RCA company and a diluted hydrofluoric acid (DHF) is used as a cleaning solution. The SC-1 is mainly used for eliminating particles or organic pollutants existing on the surface of the wafer. The DHF has a function of eliminating a natural oxide layer as well as a heavy metal.

However, if such a wet cleaning process is performed on a pattern, in which a polysilicon layer and an oxide layer are simultaneously exposed, the oxide layer is inadvertently and undesirably etched. A dry cleaning process using isopropyl alcohol (IPA) is performed to eliminate moisture after the wet cleaning process is performed. However, this process can leave a defect such as a water mark, which can adversely affect the reliability of the device and the production yield. Preventing the defect from occurring, especially in the case where an anti-reflection film such as an SiON film is used for forming the storage electrode pattern, has its limits.

Meanwhile, the device is subjected to the wet cleaning process again after the HSG layer is formed in an attempt to eliminate such a defect before the dielectric layer is formed. However, in this case, the HSG layer is etched by the wet cleaning process, thereby reducing the capacitance of the capacitor. Moreover, the HSG layer can be excessively etched to the point where hemispherical grains separate from the remainder of the HSG layer.

Still further, if the wet cleaning process is performed in a process chamber different than that used for forming the HSG layer or the dielectric layer, the HSG layer or the dielectric layer can be contaminated or undesirable layers such as a natural oxide layer can be formed during the transfer of the device to the process chamber for forming the HSG layer or dielectric layer, even though the surface of the storage electrode or the HSG layer is cleaned by the wet cleaning process. As a result, the dielectric efficiency of the capacitor is decreased.

SUMMARY OF THE INVENTION

An object of the present invention is to provide a method of manufacturing a semiconductor device including a cleaning process that will optimize the growth of an HSG layer constituting a storage electrode of the device.

To achieve this object, a method of manufacturing a semiconductor device according to the present invention includes a step of dry cleaning an exposed surface of a polysilicon pattern, on which the HSG layer is to be grown, using hydrogen in a plasma state and a fluorine-based gas. First, a polysilicon layer is formed on a semiconductor substrate. Next, a polysilicon pattern, at least a portion which is exposed, is formed by etching the polysilicon layer. Subsequently, the exposed surface of the polysilicon pattern is dry cleaned by supplying the hydrogen in a plasma state and the fluorine-based gas towards the exposed surface of the polysilicon pattern. Preferably, the exposed surface of the polysilicon pattern is also wet cleaned to remove any pollutants produced as the result of the etching process. The HSG layer is then formed on the cleaned surface of the polysilicon pattern.

During the dry cleaning process, the hydrogen in a plasma state and the fluorine-based gas chemically react with an oxide layer formed on the exposed surface of the polysilicon pattern to form a reaction layer. The dry cleaning process also preferably includes annealing the reaction layer to thereby vaporize and eliminate the reaction layer. The wet cleaning can be performed using ozone water or a standard cleaning solution (SC-1).

It is another object of the present invention to provide a method of manufacturing a semiconductor device, including a cleaning process, which prevents contaminants from remaining on layers of the device, such as an HSG layer and/or a dielectric layer.

To achieve the second object, a method of manufacturing a semiconductor device according to the present invention employs wet and dry cleaning processes before and after the forming of the HSG layer. First, a polysilicon layer is formed on a semiconductor substrate. Next, a polysilicon pattern, at least a portion which is exposed, is formed by etching the polysilicon layer. Subsequently, the exposed surface of the polysilicon pattern is wet cleaned to remove any pollutants produced as the result of the etching process. The surface is then dry cleaned by supplying hydrogen in a plasma state and fluorine-based gas towards the exposed surface of the polysilicon pattern. The HSG layer is then formed on the cleaned surface of the polysilicon pattern. Subsequently, the HSG layer is wet cleaned to remove any pollutants remaining thereon. The surface is then dry cleaned by, again, supplying hydrogen in a plasma state and fluorine-based gas towards the surface of the HSG layer. Finally, a dielectric layer is formed on the cleaned surface of the HSG layer.

According to the present invention, any pollutant or an oxide layer remaining on the storage electrode surface is chemically reacted with hydrogen in a plasma state and fluorine-based gas. The reactant can thus be easily removed by an annealing process. The condition of the surface therefore becomes optimal for growing the HSG layer thereon. Moreover, any pollutant or oxide layer remaining on the HSG layer is also chemically reacted with hydrogen in a plasma state and fluorine-based gas and thus, such a reactant can also be easily removed by an annealing process. The HSG layer is not degrade by such a gentle cleaning process. Furthermore, the cleaning process, subsequent formation of the HSG layer and of the dielectric layer can be readily carried out in a clustered facility, whereby the cleaned surface is effectively prevented from being re-contaminated. thus, highly reliable semiconductor devices can be manufactured.

BRIEF DESCRIPTION OF THE DRAWINGS

The above and other objects, features and advantages of the present invention will become more apparent by referring to the following detailed description of the preferred embodiments thereof made with reference to the attached drawings, of which.

DETAILED DESCRIPTION OF THE PREFERRED EMBODIMENTS

The preferred embodiments of the present invention will now be described in detail with reference to the attached drawings.

The Dry Cleaning Apparatus For Performing A Dry Cleaning Process

Figure 1:
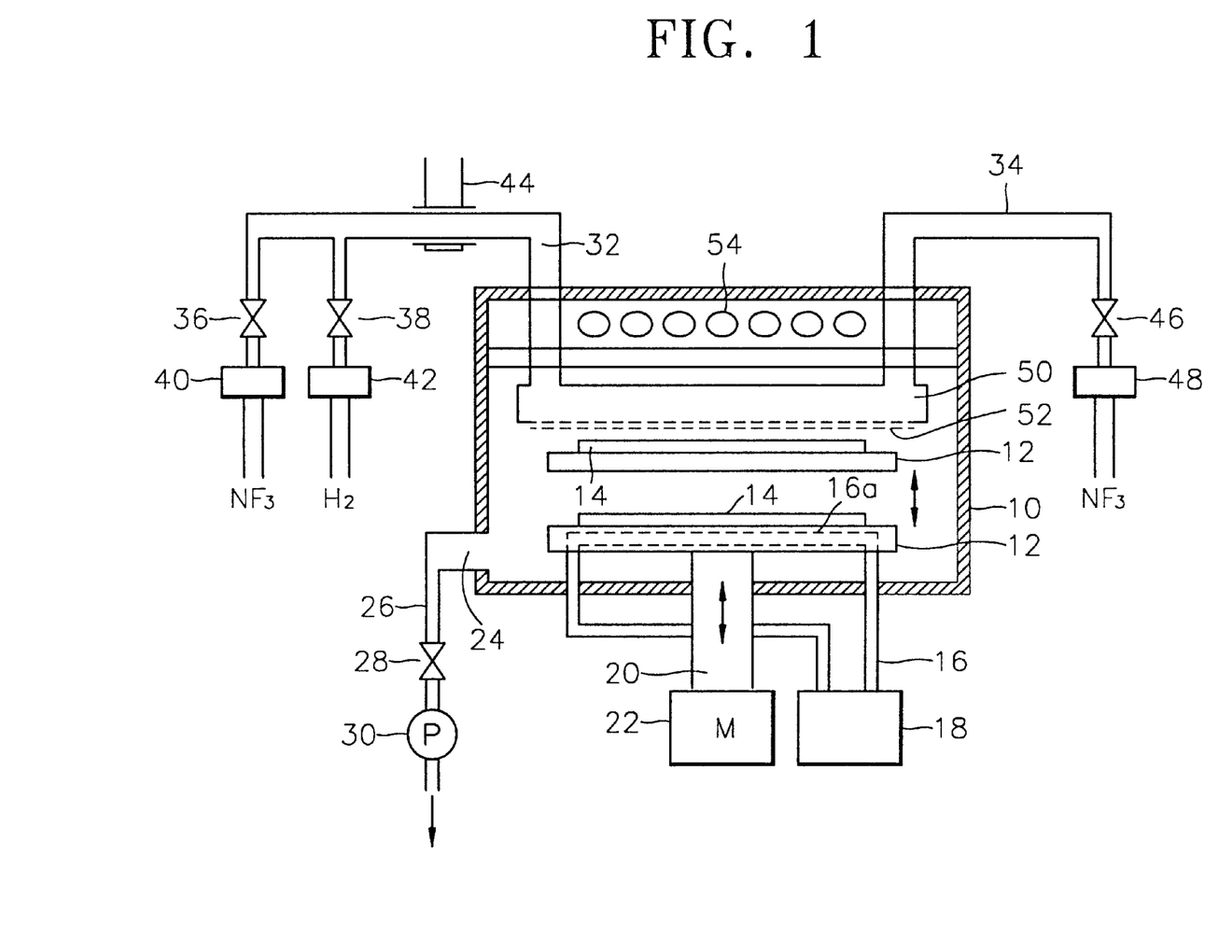
FIG. 1 is a schematic diagram of a semiconductor device processing apparatus for performing an embodiment of a method of cleaning a semiconductor substrate according to the present invention.

The dry cleaning process of the present invention can be performed in a dry cleaning apparatus invented by some of the inventors of the present invention and disclosed in Korean Patent Application No. 99-46365, which disclosure is hereby incorporated by reference. An apparatus capable of performing the method of the present invention is shown in FIG. 1. Referring now to this figure, the dry cleaning apparatus comprises a vacuum chamber 10 in which certain processes can be performed on a wafer in a vacuum, a remote type of plasma generation apparatus 44 that supplies a reaction gas into the vacuum chamber 10 after transforming it into plasma, gas diffusers 50 and 52, a heater 54 for annealing the wafer within the chamber 10, and a susceptor unit capable of controlling the location of a silicon wafer in the vacuum chamber 10.

The susceptor unit comprises a susceptor 12, on which a silicon wafer 14 to be cleaned is mounted, means for raising and lowering the susceptor 12, and means for regulating the temperature of the wafer 14 mounted on the susceptor 12. More specifically, the susceptor 12 is supported at a lower central portion of the vacuum chamber 10. The susceptor 12 can be raised and lowered inside the vacuum chamber 10 by an up-and-down transfer shaft 20 powered by a motor 22. A cooling line 16a extends through the susceptor 12. Cooling water or a cooling gas is fed through the line 16a. A first pipe 16 through which cooling water or cooling gas flows extends from a cooling water/cooling gas feeder 18 and is connected to the cooling line 16a. The temperature of the silicon wafer 14 is controlled by the temperature of the susceptor 12, which is controlled by the temperature of the cooling water or cooling gas fed through the cooling line 16a.

A reaction gas is fed into the vacuum chamber 10 through a reserve chamber 50. The reserve chamber 50 receives the reaction gas from a second pipe 32 and a third pipe 34 installed outside the vacuum chamber 10. A perforated panel 52 connected to an end of the reserve chamber 50 distributes the gas throughout the inside of the vacuum chamber 10. The second pipe 32 is connected to a source of hydrogen gas $H_2$ and a source of a fluorine-based gas $NF_3$. Switching valves 36 and 38 and mass flow controllers (MFCS) 40 and 42 for controlling the flow of gas are disposed in-line with respect to the respective sources of hydrogen gas and fluorine-based gas.

The second pipe 32 is also associated with the plasma generation apparatus 44 so that the gas is excited into a plasma before it is fed to the reserve chamber 50 within the vacuum chamber 10. More specifically, the plasma generation apparatus 44 comprises a microwave guide 44 disposed between the switching valves 36 and 38 and the end of the second pipe 32 that is connected to the reserve chamber 50. The microwave guide excites gas passing from the source of hydrogen gas and/or the source of fluorine-based gas through the switching valves 36 and 38 and the MFCs 40 and 42. The third pipe 34 feeds a fluorine-based gas in a natural state from a source of the fluorine-based gas $NF_3$ to which the third pipe 34 is connected. A switching valve 46 and a MFC 48 are disposed in-line at the source of $NF_3$ to which the third pipe 34 is connected.

Note, the locations of the sources of the $H_2$ and the $NF_3$ can be changed depending on the process to be performed. Furthermore, and if necessary, argon (Ar) as well as nitrogen ($N_2$) gas supplies can be provided.

Next, a vent 24 is provided at the bottom of the vacuum chamber 10 for venting gas from the vacuum chamber 10 to maintain the state of the vacuum created in the chamber 10.

A fourth pipe 26 is connected to the vent 24. A switching valve 28 and a vacuum pump 30 are disposed in-line with respect to the fourth pipe 26.

The pressure in the vacuum chamber while the reaction gas is being supplied (referred to as "downflow") is automatically controlled by a smart valve (not shown) disposed at the bottom of the vacuum chamber 10. The pressure in the vacuum chamber during the downflow may be kept at 0.1–10 Torr so that the reaction gas is easily adsorbed into the silicon wafer 14.

Figure 2:
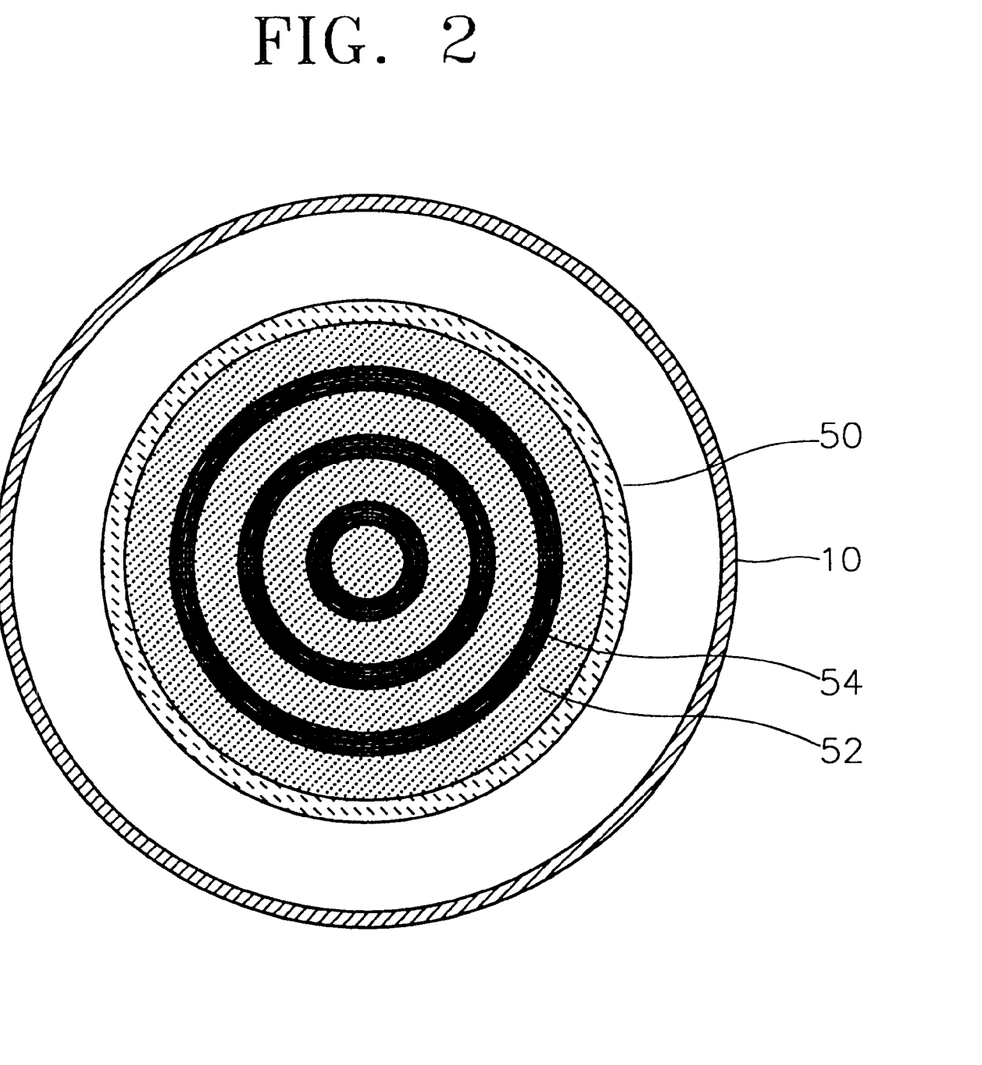
FIG. 2 is a horizontal sectional view of a vacuum chamber of the semiconductor device processing apparatus of FIG. 1.

The heater 54 for annealing the silicon wafer 14 is interposed between the reserve chamber 50 and the ceiling of the vacuum chamber 10. The heater 54 comprises a lamp or a laser. A neodymium (Nd)-YAG laser, a carbon dioxide ($CO_2$) laser or an eximer laser may be used. As shown in FIG. 2, the heater 54 is of the same overall size and shape (circular) as the silicon wafer. In particular, the heater 54 comprises a plurality of concentric heating elements which uniformly heat the silicon wafer 14.

Figure 3:
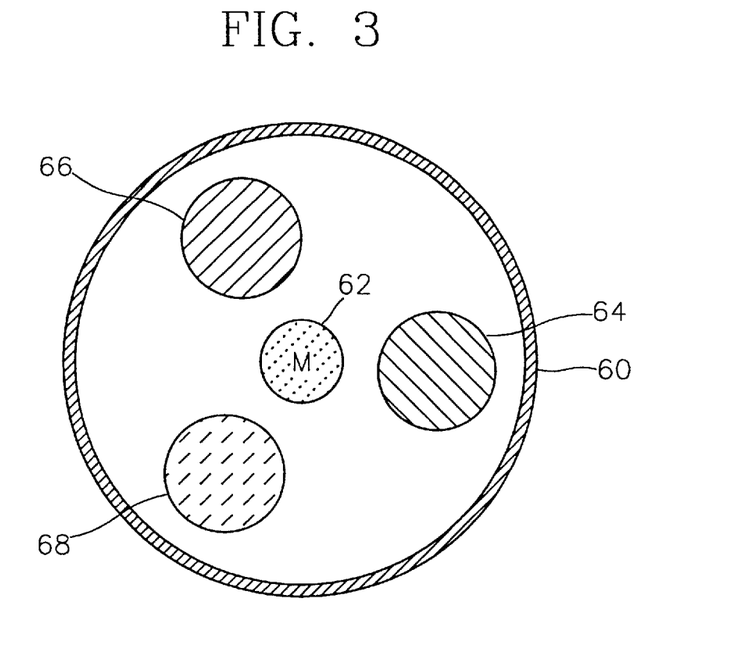
FIG. 3 is a horizontal sectional view of the vacuum chamber of another semiconductor device processing apparatus for performing another embodiment of a method of cleaning a semiconductor substrate according to the present invention.

FIG. 3 is a horizontal sectional view of another dry cleaning apparatus for performing a dry cleaning process according to the present invention. In the figure, reference numeral 60 designates a vacuum chamber, 62 a motor, 64 a loading/unloading and post-treatment module, 66 a downflow module, and 68 an annealing module. A rotary plate is supported for rotation at the bottom of the vacuum chamber 60. An output shaft of the motor 62 is connected to the center of the rotary plate for rotating the plate. The loading/unloading and post-treatment module 64, the downflow module 66 and the annealing module 68 are disposed around the rotary plate.

A vacuum system (not shown) is connected to the vacuum chamber 60. The rotary plate can be rotated to transfer the silicon wafer in the vacuum chamber 60. Specifically, the silicon wafer may be moved from one module to another by the rotary plate. Accordingly, a downflow process and an annealing process may be sequentially performed in the same chamber, and it is possible to sequentially repeat the downflow process and the annealing process several times.

Figure 4:
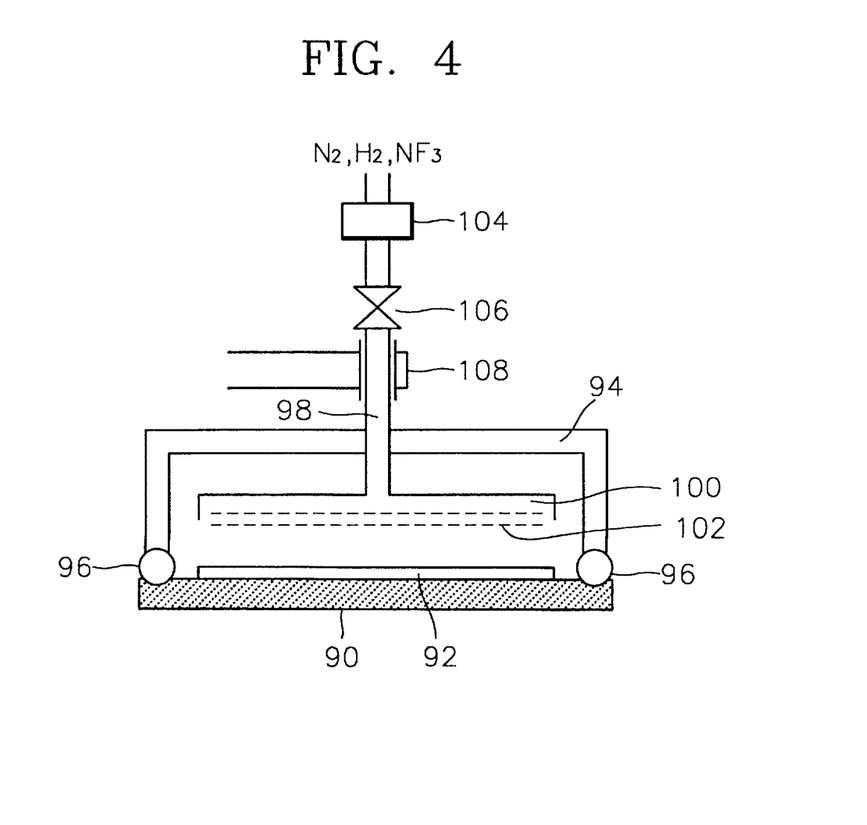
FIG. 4 is a schematic diagram of the downflow module of the apparatus of FIG. 3.

FIG. 4 is a vertical sectional view of the downflow module 66. The downflow module 66 comprises a susceptor 90 disposed on the rotary plate and configured to support a silicon wafer 92 thereon, a downflow chamber 94 that can be raised and lowered relative to the rotary plate to cover the susceptor 90, a gas diffuser (100 and 102) that is disposed in an upper portion of the downflow chamber 94 and is capable of being raised and lowered, and a gas feeding pipe 98 connected to the gas diffuser for feeding gas to the wafer mounted to the susceptor. Guide rings 96 are installed at ends of the downflow chamber 94 to closely secure the downflow chamber 94 to the rotary plate on which the susceptor 90 is disposed.

The gas diffuser comprises a gas feeding line 100 receiving gas from the gas feeding pipe 98 and a perforated panel 102 connected to one end of the gas feeding line 100 to supply reaction gas over the silicon wafer 92. Reaction gas sources $N_2$, $H_2$, and $NF_3$ are connected to the other end of the gas feeding pipe 98. Reaction gases fed from the reaction gas sources pass through a mass flow controller 104 disposed in-line with the gas feeding pipe 98. Accordingly, the flow of the reaction gas is controlled and the gas passes through a switching valve 106. A microwave guide 108 is interposed between the switching valve 106 and the other end of the gas feeding pipe 98 to excite the reaction gas passing through the gas feeding pipe 98, i.e., to transform the gas into plasma.

The annealing module 68 comprises an annealing chamber, a susceptor disposed at the bottom of the chamber and configured to support a silicon wafer thereon, an annealing chamber that can be moved vertically relative to the rotary plate to cover the susceptor, and a heater disposed in an upper part of the annealing chamber and capable of being raised and lowered, for annealing the silicon wafer. Guide rings are provided at ends of the annealing chamber to closely secure the annealing chamber to the rotary plate on which the susceptor is mounted. The heater has the same structure shown in FIG. 2, namely a plurality of concentric heating elements that uniformly heat the silicon wafer.

The loading/unloading and post-treatment module 64 comprises a chamber for loading/unloading or post-treating a wafer.

Basically, in the dry cleaning method according to the present invention, a layer of $(NF_4)_2SiF_6$ is formed on the substrate during the downflow process by the reaction of a natural oxide layer formed on the surface of the silicon wafer with the mixture of hydrogen and fluorine-based gases. The layer of $(NF_4)_2SiF_6$ is vaporized and eliminated by the subsequent annealing process performed in-situ in the same chamber.

When the cleaning apparatus of FIGS. 1 and 2 is used, the downflow process is performed while the susceptor 12 is positioned at the bottom of the vacuum chamber 10. Then the susceptor 12 is moved to the upper portion of the vacuum chamber 10 whereupon the annealing process is performed. In this case, however, the conditions established during the downflow process can affect the subsequent annealing process. Thus, the temperature in the vacuum chamber may be unstable, it may be difficult to maintain the temperature of the silicon wafer uniform during each process, or particles may be produced in the vacuum chamber.

The cleaning apparatus of FIGS. 3 and 4 obviates such potential problems because the downflow module 66 and the annealing module 68 are disposed separately in the vacuum chamber. And, the apparatus of FIGS. 3 and 4 is useful when the oxide layer can not be eliminated entirely by performing a single cleaning process, because the downflow process and the annealing process may be performed in the same chamber sequentially and repeatedly.

The Clustered Facility For Manufacturing A Capacitor Structure

The above-described dry cleaning apparatus and apparatus for forming an HSG layer and a dielectric layer are clustered in a single facility. More particularly, a transfer chamber module is directly interposed between the vacuum chamber of the cleaning apparatus and a deposition process chamber in which the HSG layer can be formed. An inert uniform vacuum environment can be established and maintained inside of the transfer chamber module.

The transfer chamber module transfers the semiconductor substrate from the dry cleaning apparatus, after the substrate has been subjected to the dry cleaning process of the present invention, to the deposition process chamber where a deposition process is performed in a vacuum. The transfer chamber module prevents pollutants such as organic pollutants and particles from being re-adsorbed by the semiconductor substrate, after the substrate has been cleaned, and prevents a natural oxide layer from re-forming on the cleaned surface.

The Method of Manufacturing A Semiconductor Capacitor

Figure 5:
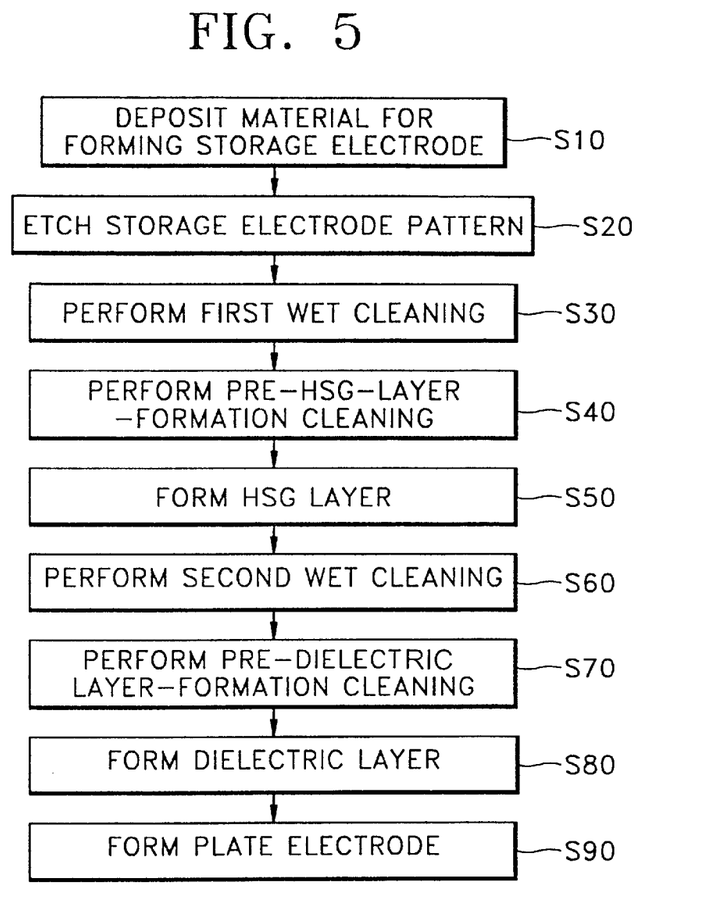
FIG. 5 is a flow chart of an embodiment of a method of manufacturing a semiconductor capacitor according to the present invention.
Figure 6:
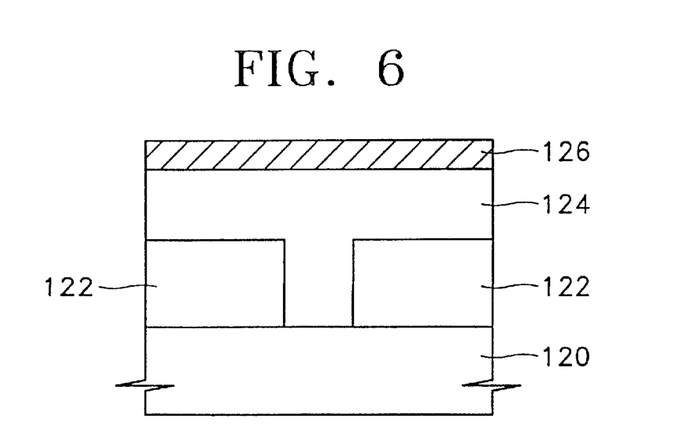
FIGS. 6 to 10 are cross-sectional views of a semiconductor substrate illustrating steps of manufacturing the semiconductor capacitor according to the flow chart of FIG. 5.

FIG. 5 is a flow chart of the process of manufacturing a semiconductor capacitor according to the present invention, and FIGS. 6 to 10 illustrate the manufacturing process.

Referring to FIGS. 5 to 10, an interlayer insulating layer 122 is formed on a silicon substrate 120. The interlayer insulating layer 122 may be an oxide film, a nitride film, or oxide and nitride films stacked one upon the other. Furthermore, substructures such as gate electrodes may be formed in the interlayer insulating layer 122. Then, a photoresist pattern (now shown) is formed using a photolithography technique. The insulating layer 122 is etched using the photoresist pattern as a mask to form a contact hole that exposes the semiconductor substrate. The contact hole may expose the surface of the semiconductor substrate 120 itself, or may expose the substrate by exposing surfaces of conductive pads of the substructures contacting an active region of the semiconductor substrate.

Next, a storage electrode formation material 124 (FIG. 6) of the semiconductor capacitor, for example an amorphous silicon which may contain conductive impurities, is deposited over the entire surface of the insulating layer 122 in which the contact hole is formed (S10).

Figure 7:
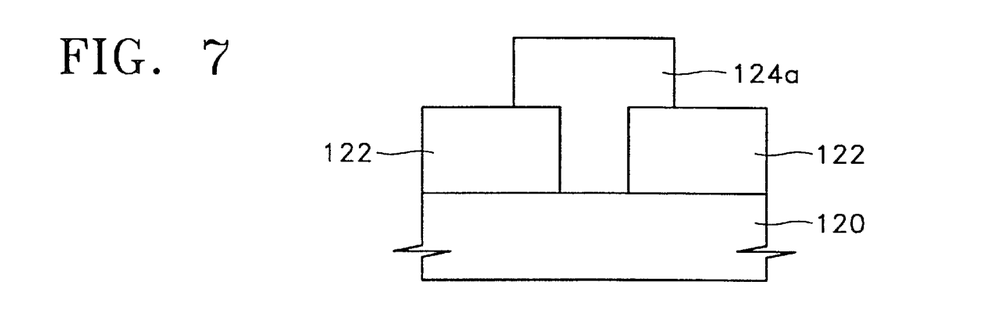

A photoresist layer 126 is then formed on the storage electrode formation material 124 and is patterned using a typical photolithography process. Note, an anti-reflection film, such as an SiON film, may be formed on the insulating layer 122 before the photoresist layer 122 is formed. Subsequently, the storage electrode formation material 124 is etched (S20) using the patterned photoresist layer as a mask, to thereby form a storage electrode pattern 124a (FIG. 7). The storage electrode pattern 124a may be any one of various known types such as a cylinder type, a stack type, or a pin type. The residual photoresist pattern is removed after the storage electrode pattern 124a is formed.

Afterwards, a first wet cleaning process is performed to eliminate any pollutant left on the exposed surfaces of the interlayer insulating layer 122 and the storage electrode pattern 124a as a result of the process of forming the storage electrode pattern 124a (S30). A standard cleaning solution SC-1 developed by the RCA company or ozone water is used as a cleaning solution. The SC-1, which consists of a mixture of ammonia ($NH_4OH$), hydrogen peroxide ($H_2O_2$), and water ($H_2O$), is useful in eliminating particles or organic pollutants. The ozone water is useful in eliminating residual photoresist, metal pollutants, and organic matter. In particular, the ozone water can oxidize organic matter and particles on the exposed surface of the storage electrode so that the oxidized materials can be easily removed in a subsequent dry cleaning process. Ozone water having a concentration of 1–100 PPM is used and the temperature thereof is 0–30° C. or so. The surface of the storage electrode 124 can be fully cleaned when using such ozone water for 1 to 20 minutes.

A pre-HSG-layer-formation cleaning is performed before an HSG layer is formed on the exposed surface of the storage electrode pattern 124a (S40). The pre-HSG-layer-formation-cleaning process effectively eliminates a natural oxide layer or surface pollutants naturally formed on the surface of the storage electrode pattern 124a without damaging a lower part of the storage electrode pattern 124a. The pre-HSG-layer-formation cleaning is performed using the above-described dry cleaning apparatus.

More specifically, hydrogen in a plasma state and a fluorine-based gas are directed onto the surface of the storage electrode pattern 124a, on which the natural oxide layer is formed. Consequently, the natural oxide layer is transformed into a reaction layer, having a composition such as $(NH_4)_2SiF_6$, by the chemical reaction of the oxide layer and the gases. Subsequently, the reaction layer created by the chemical reaction is vaporized and eliminated by the annealing process.

The hydrogen is used in a plasma state but the fluorine-based gas may be used in either a natural (gaseous) state or a plasma state. That is, a gas mixture of hydrogen and fluorine-based gases may be transformed into a plasma state and then supplied to the silicon wafer, or the hydrogen may be directed onto the substrate in a plasma state while the fluorine-based gas is also directed onto the substrate in a natural state. Note, the fluorine-based gas may be nitrogen trifluoride ($NF_3$), sulfur hexafluoride ($SF_6$) or chlorine trifluoride ($ClF_3$).

When hydrogen in a plasma state and fluorine-based gas are directed onto the semiconductor substrate (at a ratio, for example, of $NF_3$ to hydrogen plasma of 0.1–100), the gases chemically react with the oxide layer, e.g., silicon dioxide ($SiO_2$), thereby forming a by-product in the form of a layer of material, such as $(NH_4)_2SiF_6$, where the gases and the oxide layer meet. After such a reaction layer is formed to some extent, it serves as a barrier layer against further chemical reaction, i.e., it stops the chemical reaction between the gases and the oxide layer.

The annealing is performed in a state in which the chemical reaction between the gases and the oxide layer has stopped. Accordingly, the reaction layer is vaporized and exhausted from the chamber. Also, the oxide layer, on which the reaction layer existed, is eliminated. A passivation layer, in which hydrogen atoms are combined, is formed on the exposed surface after pollutants such as a natural oxide layer or a surface oxide are eliminated. The passivation layer prevents the surface from being re-oxidized to some extent.

If the oxide layer to be eliminated is thin like a natural oxide layer, it will easily be eliminated by performing the downflow process and the annealing process only once. However, the processes may be repeated a number of times depending on the thickness of the oxide layer to be eliminated.

Moreover, the downflow process, in which the chemical reaction between the supplied gases and the oxide layer takes place, and the annealing process are sequentially performed in one chamber. When the cleaning apparatus of FIG. 1 is used, the chemical reaction takes place at the bottom of the vacuum chamber 10 whereas the removal of the oxide takes place at the upper portion of the vacuum chamber 10 where the heater 54 is disposed. On the other hand, when the cleaning apparatus of FIG. 3 is used, the downflow process and the annealing process are sequentially performed in several process modules disposed within the vacuum chamber 60. Specifically, the chemical reaction takes place in the downflow module 66 and the oxide is removed in the annealing module 68.

Now, the pre-HSG-layer-formation cleaning according to the present invention (S40), using each of the cleaning apparatuses of FIGS. 1 and 3, will be described in detail.
1) A cleaning method using the cleaning apparatus of FIGS. 1 and 2

A silicon wafer 14, on which the storage electrode pattern 124a is formed, is mounted on the susceptor 12. Gas existing in the vacuum chamber 10 is exhausted through the vent 24 and the fourth pipe 26, using the switching valve 28 and the vacuum pump 30, to create a vacuum inside the vacuum chamber 10.

The temperatures of the susceptor 12 and the silicon wafer 14 mounted thereon are regulated by a thermostat (not shown) and feeding cooling water or cooling gas through the cooling line 16a extending through the susceptor 12 under the control of the thermostat. Specifically, the temperature of the silicon wafer 14 is regulated to be uniform and preferably within the range of −25–+50° C.

Hydrogen in a plasma state and gas containing fluorine (in a plasma or gaseous state) are fed into the vacuum chamber 10 (downflow process) where they chemically react with a natural oxide layer formed on the surface of the silicon wafer 14. Again, nitrogen trifluoride ($NF_3$), sulfur hexafluoride ($SF_6$), or chlorine trifluoride ($ClF_3$) can be used. In addition, argon (Ar) and nitrogen ($N_2$) plasma may be supplied into the vacuum chamber 10 as well to increase the effect of eliminating the natural oxide layer.

The pressure in the vacuum chamber 10 is automatically regulated by the smart valve (not shown) to within 0.1–10 Torr. The downflow process may be performed for approximately 20–600 seconds.

When the chemical reaction stops due to the creation of the reaction layer, the susceptor 12 is raised to the upper part of the vacuum chamber 10 using the up-and-down transfer shaft 20 and the motor 22. The reaction layer is vaporized by annealing the silicon wafer 14 mounted on the susceptor 12 using the heater 54 disposed in the upper part of the vacuum chamber 10. The annealing process is preferably performed at a temperature of 100–500° C. for 20–600 seconds. The annealing process is preferably performed in the same chamber as the downflow process, but can be performed in a separate annealing chamber.

The by-product vaporized from the silicon wafer 14 is exhausted through the vent 24 and the fourth pipe 26. The susceptor 12 located at the upper part of the vacuum chamber 10 is then lowered using the up-and-down transfer shaft 20 and the motor 22.

2) A cleaning method using the cleaning apparatus of FIGS. 3 and 4

Referring to FIGS. 3 and 4, the silicon wafer 92, over which the storage electrode pattern 124a is formed, is mounted on the susceptor 90 of the loading/unloading and post-treatment module 64. The susceptor 90 is transferred to a location beneath the downflow chamber 94 of the downflow module 66 by the rotary plate as driven by the motor 62. The downflow chamber 94 is lowered relative to the rotary plate to cover the susceptor 90 and is sealed and secured to the rotary plate using the guide rings 96. Hydrogen in a plasma state and gas containing fluorine (fluorine-based gas) are fed into the downflow chamber 94 where they chemically react with the natural oxide layer on the surface of the silicon wafer 92, thereby forming a reaction layer.

The downflow chamber is detached from the rotary plate and is raised relative to the rotary plate. The susceptor 90 is then transferred by the rotary plate to a location beneath the annealing chamber of the annealing module 68. Similarly, the inside of the annealing chamber is lowered relative to the rotary plate over the susceptor and is completely sealed using the guide rings. The reaction layer formed on the surface of the silicon wafer is vaporized by annealing the silicon wafer using the heater disposed in the upper portion of the annealing chamber. The by-product of the vaporized reaction layer is exhausted.

After the annealing chamber is detached from and raised relative to the rotary plate, the susceptor is transferred to a location beneath a loading/unloading and post-treatment chamber (not shown) of the loading/unloading and post-treatment module 64. The loading/unloading and post-treatment module 64 is completely sealed by lowering the loading/unloading and post-treatment chamber relative to the rotary plate and securing it to the rotary plate using guide rings. If the surface of the silicon water requires further processing, it is post-treated with hydrogen thereby forming a hydrogen protection layer. The silicon wafer is then unloaded.

Figure 8:
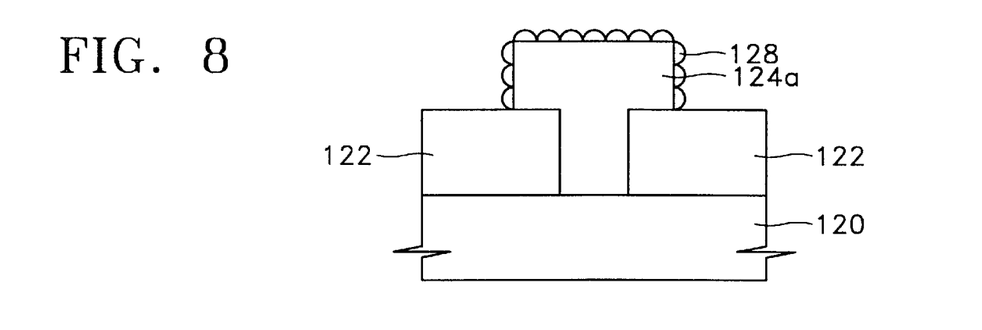

Next, referring to FIGS. 5 and 8, an HSG layer 128 is formed (S50) on the exposed surface of the storage electrode pattern 124a which has been subjected to the pre-HSG-layer-formation cleaning process. The process of forming the HSG layer 128 is a known process per se in which seed particles are supplied to the exposed surface of the storage electrode pattern 124a, the seed particles serving as nuclei of the HSG. The seed particles are heated to the transition temperature of silicon between noncrystalline and crystalline states, whereby the HSGs are grown to increase the surface area of a storage electrode.

As was also mentioned above, the method is carried out in a clustered facility whereby the pre-HSG-layer-formation cleaning process (S40) and the HSG layer forming process (S50) are respectively performed in a cleaning process chamber module and a deposition process chamber module. Consequently, the natural oxide layer is prevented from being re-grown and pollutants are prevented from being redeposited on the exposed surface of the storage electrode pattern 124a after the-pre-HSG-layer-formation cleaning process is performed.

Next, a second wet cleaning (S60) process is performed to eliminate any pollutants, e.g. remaining photoresist, metal pollutants, and organic matter, left on the exposed surfaces of the interlayer insulating layer 122 and the HSG layer 128 as a result of the process of forming the HSG layer 128. The second wet cleaning process is basically identical to the first wet cleaning process (S30) and includes dipping the semiconductor substrate into a cleaning solution or spraying the semiconductor substrate with the cleaning solution. SC-1 or ozone water is used as the cleaning solution. Ozone water is particularly useful in that it can oxidize organic matter and particles on the exposed surface of the HSG layer 128 whereupon the oxidized materials may be easily removed by the subsequent dry cleaning process. As with the first wet cleaning process, the concentration of the ozone water used in the second wet cleaning process is 1–100 PPM and the temperature thereof is 0–30° C. or so. Under these conditions, the surface of the HSG layer 128 can be fully cleaned in 1–20 minutes or so.

Figure 9:
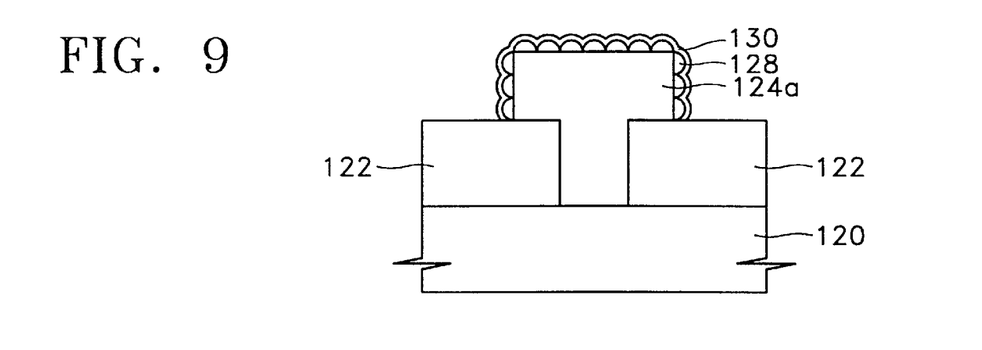

Next, a pre-dielectric-layer-formation cleaning process is performed (S70). The cleaning process effectively eliminates the natural oxide layer or surface pollutants naturally formed on the surface of the HSG layer 128 without damaging the lower part of the HSG layer 128. The pre-dielectric-layer-formation cleaning process (S70) may be basically performed in the same way as the pre-HSG-layer-formation cleaning (S40) process. Therefore, a detailed description thereof will be omitted.

Figure 10:
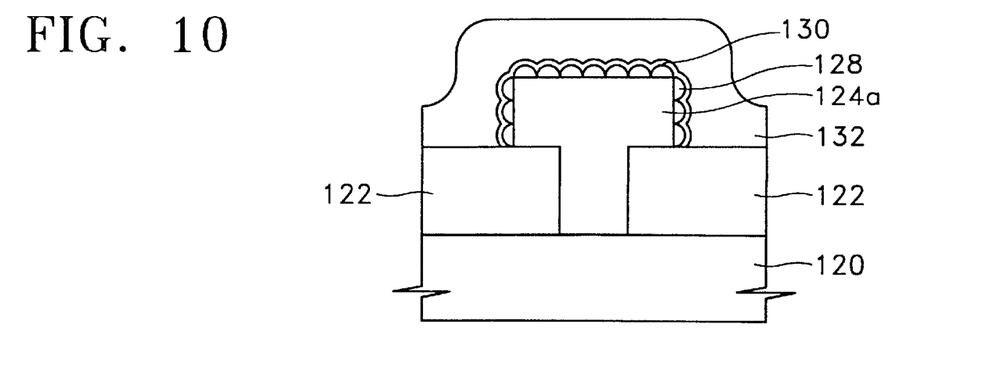

Afterwards, the dielectric layer 130 of the capacitor, such as an ONO layer or a TaO layer, is formed (S80) on the cleaned surface of the HSG layer 128 using a deposition method well-known per se. Subsequently, a plate electrode 132 is formed by depositing a conductive material over the entire surface of the semiconductor substrate and then patterning the same (S90).

Meanwhile, as mentioned above, the clustered facility includes not only the cleaning process chamber module but also a deposition process chamber module, and a transfer chamber module connecting the cleaning chamber module and the process chamber module. The pre-dielectric-layer-formation cleaning process (S70) and the dielectric layer formation process (S80) are respectively performed in the cleaning process chamber module and the deposition process chamber module, and is transferred therebetween in a vacuum via the transfer chamber module. A separate deposition process chamber module for forming the plate electrode 132 may be incorporated into the clustered facility. The use of the clustered in facility in carrying out such a method can prevent the natural oxide layer from being re-grown or pollutants from being re-deposited on the surfaces of the HSG layer 128 and the dielectric layer 130 once the same has been cleaned by the pre-dielectric-layer-formation cleaning process.

Figure 11:
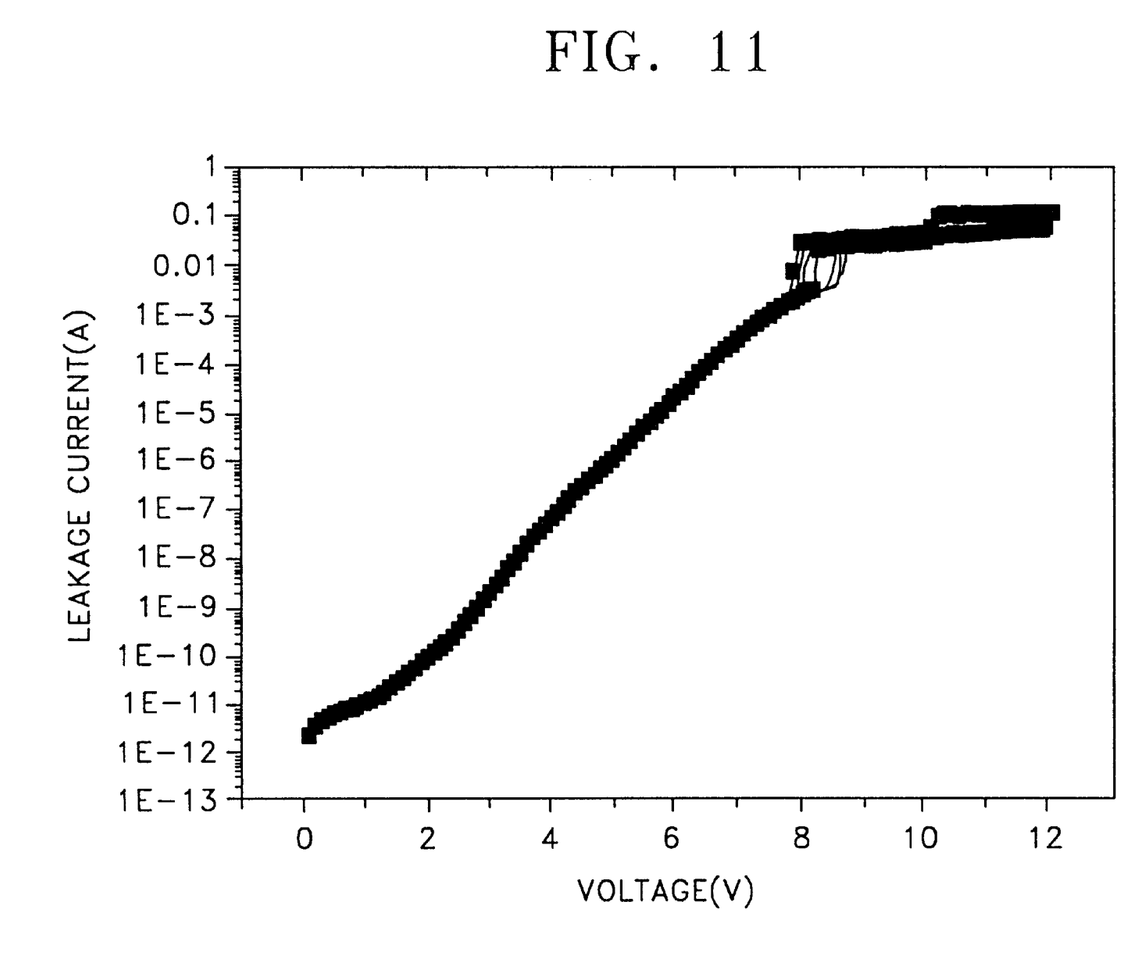
FIG. 11 is a graph comparing leakage current of semiconductor capacitors manufactured according to the present invention and according to the prior art.
Figure 12:
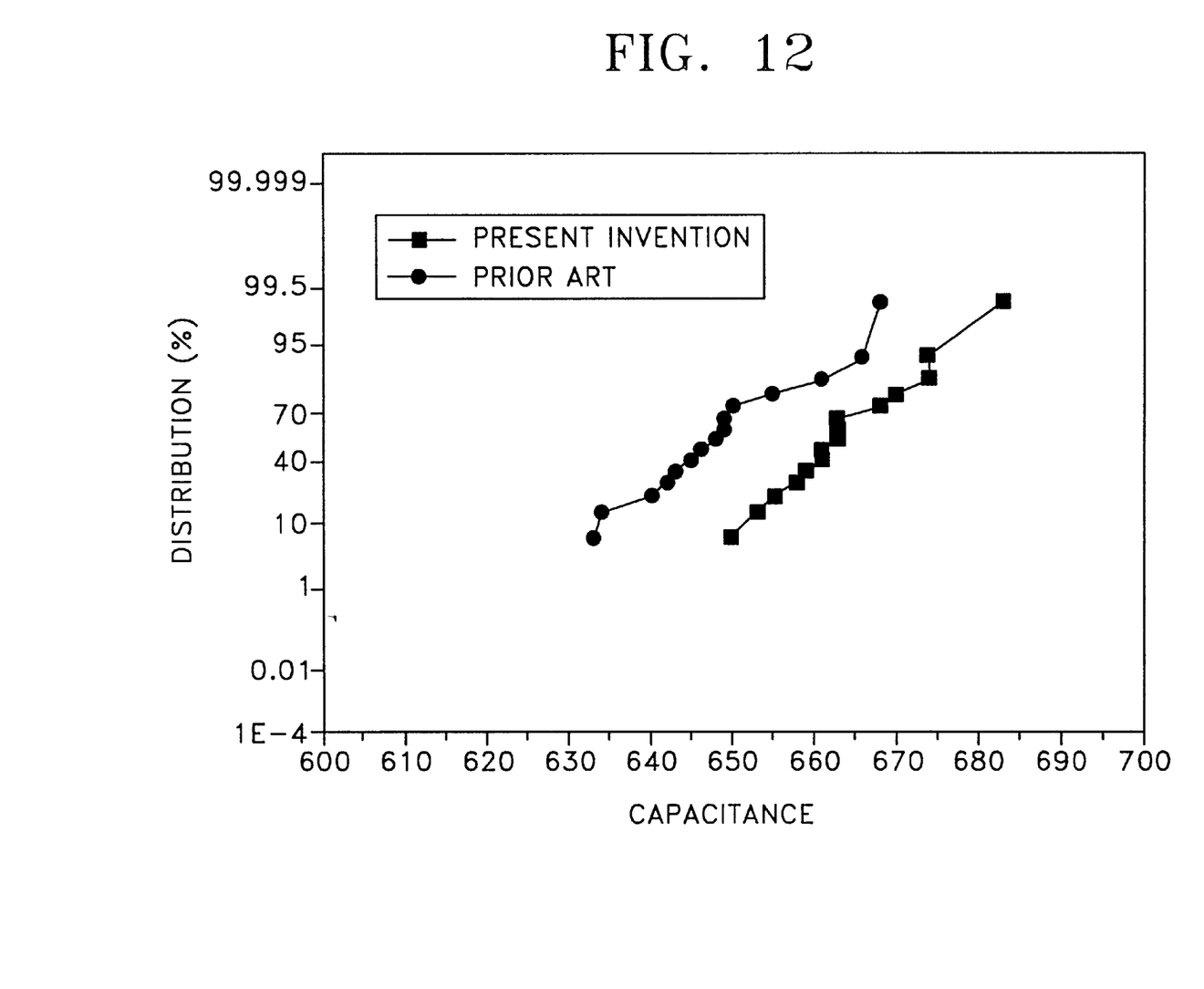
FIG. 12 is a graph comparing capacitance of semiconductor capacitors manufactured according the present invention and according to the prior art.

FIGS. 11 and 12 are graphs comparing leakage current and capacitance of semiconductor capacitors manufactured according to the present invention according to the prior art. In FIG. 11, the horizontal axis represents voltage (V) and the vertical axis leakage current (I). In FIG. 12, the horizontal axis represents capacitance (pF) when a voltage of 1.5 V is impressed across the capacitor and the vertical axis distribution (%) related with locations for measuring.

The results shown in FIGS. 11 and 12 are for semiconductor capacitors manufactured according to the prior art and according to the present invention as follows. In the case of the semiconductor capacitor manufactured according to the prior art, a pre-HSG-layer-formation cleaning process and a pre-dielectric-layer-formation cleaning process were performed for 90 seconds using a dilute HF (DHF) solution in a ratio of 200:1 (wet cleaning). In the case of the semiconductor capacitor manufactured according to the present invention, the pre-HSG-layer-formation cleaning process and the pre-dielectric-layer formation cleaning process were performed for 3 minutes using a gas mixture of $NF_3$:$H_2$:$N_2$ in a ratio of 90:10:400 sccm (dry cleaning). As illustrated in the graph of FIG. 11, the leakage currents between the capacitors manufactured according to the prior art and according to the present invention can hardly be distinguished. That is, the leakage current is not affected by substituting the present invention for the prior art even though, in the present invention, the dry cleaning process is performed not only before the HSG layer is formed but also between the forming of the HSG layer and the forming of the dielectric layer. On the other hand, as illustrated in FIG. 12, the capacitance is considerably improved when the present invention is employed, as compared with the prior art.

Other major differences between the wet cleaning method of the prior art in which a hydrofluoric cleaning solution is used and the dry cleaning method according to the present invention are as follows.

1) The states of reactants used to produce the reaction layers are different. Namely, in the prior art, hydrofluoric acid is used in a liquid state and in the present invention, hydrogen plasma and fluorine-based plasma or gas are used. Accordingly, the present invention is less costly to practice.

2) In the present invention, each process is sequentially performed in one vacuum chamber. Thus, the time required for performing the entire process is less than in the prior art, it is easier to control the various process parameters, and the equipment is smaller than that used to perform the prior art wet cleaning method.

3) The present invention makes it easier to control the process before and after the downflow process because plasma is used. Consequently, the state of water on the surface of the substrate may be optimally controlled in the time the reaction takes place at the surface of the substrate.

4) The conventional dry cleaning method of eliminating an oxide layer involves demolishing the particles constituting the oxide layer using the kinetic energy of gas injected into the reaction chamber toward the wafer at a high velocity. Thus, the layer underlying the oxide layer is prone to being damaged (etched). On the other hand, in the present invention, the product of the chemical reaction of the supplied gas and the oxide layer is vaporized. The oxide layer is thus eliminated gently so as to minimize the damage to the layer underlying the oxide layer. When the underlying layer is an HSG layer, the present invention therefore maximizes the capacitance by preventing a degradation of the HSG layer.

5) The present invention minimizes the required overall cleaning time in cases in which the downflow and annealing processes need to be repeatedly performed. Simultaneously, the present invention prevents the creation of a second natural oxide layer and the contamination of the substrate by particles between processes. Moreover, in the present invention, the cleaning processes and each subsequent deposition process can be performed in process chambers of a clustered facility to prevent the cleaned surface of the HSG from being exposed to air and re-oxidized. Thus, the present invention yields more reliable semiconductor devices than when the prior art method is used.

Finally, although the present invention has been described with respect to certain preferred embodiments thereof, various changes to and modifications of the present invention will become apparent to those skilled in the art. All such changes and modifications are seen to be within the true spirit and scope of the present invention as defined by the appended claims.

What is claimed is:

1. A method of manufacturing an electrode of a semiconductor device, comprising the steps of:

forming a polysilicon layer on a semiconductor substrate;

etching the polysilicon layer to form a polysilicon pattern having an exposed surface;

dry cleaning the exposed surface of the polysilicon pattern, said dry cleaning comprising directing hydrogen in a plasma state and a fluorine-based gas toward the exposed surface of the polysilicon pattern so that they chemically react with an oxide layer formed on the surface to form a reaction layer, and subsequently annealing the reaction layer to vaporize and thereby eliminate the reaction layer from the surface; and subsequently forming a hemispherical grain (HSG) layer on the exposed surface of the polysilicon pattern.

2. The method of claim 1, and further comprising wet cleaning the exposed surface of the polysilicon pattern between said forming of the polysilicon pattern and said dry-cleaning of the exposed surface of the polysilicon pattern, said wet cleaning comprising flushing the exposed surface of the polysilicon pattern with a liquid cleaning solution.

3. The method of claim 1, and further comprising dry cleaning the surface of the HSG layer, said dry cleaning of the surface of the HSG layer comprising directing hydrogen in a plasma state and a fluorine-based gas toward the surface of the HSG layer.

4. The method of claim 3, and further comprising wet cleaning the exposed surface of the polysilicon pattern between said forming of the HSG layer and said dry cleaning of the surface of the HSG layer, said wet cleaning comprising flushing the surface of the HSG layer with a liquid cleaning solution.

5. The method of claim 1, wherein said supplying of the hydrogen in a plasma state and the fluorine-based gas, and said annealing of the reaction layer are sequentially performed in the same vacuum chamber.

6. The method of claim 1, wherein said dry cleaning comprises positioning the substrate in a downflow chamber connected to sources of the hydrogen in a plasma state and the fluorine-based gas, and said annealing comprises transferring the substrate from the downflow chamber to an annealing chamber and heating the reaction layer once the substrate is positioned in the annealing chamber.

7. The method of claim 1, and further comprising transferring the substrate to a processing chamber through a transfer chamber in which an inert atmosphere is maintained immediately after the exposed surface of the polysilicon pattern is dry cleaned, and wherein said forming of the HSG layer is performed in the processing chamber.

8. The method of claim 4, wherein the liquid cleaning solution is one of ozone water and a standard cleaning solution (SC-1).

9. The method of claim 8, wherein the liquid cleaning solution is ozone water having a concentration of ozone of 1–100 PPM, and said wet cleaning is carried out while the temperature thereof is in a range of 0–30° C.

10. The method of claim 1, wherein said dry cleaning comprises creating a gaseous mixture of hydrogen and fluorine-based gas, transforming the gaseous mixture into plasma, and directing the plasma onto the exposed surface.

11. The method of claim 1, wherein said dry cleaning comprises directing the hydrogen in a plasma state and the fluorine-based gas onto the exposed surface of the polysilicon pattern.

12. The method of claim 1, wherein the fluorine-based gas is a gas selected from the group consisting of nitrogen trifluoride ($NF_3$), sulfur hexafluoride ($SF_6$) and chlorine trifluoride ($ClF_3$).

13. The method of claim 10, and further comprising supplying the plasma together with nitrogen ($N_2$) and argon (Ar).

14. The method of claim 1, wherein said dry cleaning comprises maintaining the hydrogen in a plasma state and the fluorine-based gas at a pressure of 0.01–10 Torr and at a temperature of −25–50° C., and said annealing is performed at a temperature of 100–500° C.

15. A method of manufacturing a semiconductor device, comprising the steps of:

providing a semiconductor substrate on which an interlayer insulating layer having a contact hole is formed;

forming a layer of polysilicon layer on the insulating layer so as to fill the contact hole;

etching the polysilicon layer to form a pattern therefrom in the form of a storage electrode of a semiconductor capacitor;

wet cleaning the exposed surface of the storage electrode pattern to remove any pollutant therefrom, said wet cleaning comprising flushing the exposed surface with a liquid cleaning solution;

subsequently dry cleaning the exposed surface of the storage electrode pattern, said dry cleaning comprising directing hydrogen in a plasma state and a fluorine-based gas toward the exposed surface so that they chemically react with an oxide layer formed on the exposed surface to form a reaction layer, and subsequently annealing the reaction layer to vaporize and thereby eliminate the reaction layer from the surface;

subsequently forming a hemispherical grain (HSG) layer on the exposed surface of the storage electrode pattern;

wet cleaning the exposed surface of the HSG layer to remove any pollutant therefrom, said wet cleaning of the exposed surface of the HSG layer comprising flushing the exposed surface of the HSG layer with a liquid cleaning solution;

subsequently dry cleaning the exposed surface of the HSG layer, said dry cleaning of the exposed surface of the HSG layer comprising directing hydrogen in a plasma state and a fluorine-based gas toward the exposed surface of the HSG layer so that they chemically react with an oxide layer formed on the exposed surface of the HSG layer to form a reaction layer, and subsequently annealing the reaction layer at the surface of the HSG layer to vaporize and thereby eliminate the reaction layer from the surface of the HSG layer; and subsequently forming a dielectric layer on the cleaned surface of the HSG layer.

16. The method of claim 15, wherein said steps of dry cleaning each comprise positioning the substrate in the same downflow chamber connected to sources of the hydrogen in a plasma state and the fluorine-based gas, and said annealing comprises transferring the substrate from the downflow chamber to an annealing chamber and heating the reaction layer once the substrate is positioned in the annealing chamber.

17. The method of claim 15, wherein said steps of dry cleaning each comprise positioning the substrate in a downflow chamber connected to sources of the hydrogen in a plasma state and the fluorine-based gas, and further comprising transferring the substrate from the downflow chamber to a processing chamber through a transfer chamber in which an inert atmosphere is maintained immediately after the exposed surface of the polysilicon pattern is dry cleaned, and wherein said forming of the HSG layer is performed in the processing chamber.

18. The method of claim 15, and further comprising transferring the substrate to a processing chamber through a transfer chamber in which an inert atmosphere is maintained immediately after the exposed surface of the HSG layer is dry cleaned, and wherein said forming of the dielectric layer is performed in the processing chamber.

19. The method of claim 15, wherein the liquid cleaning solution is one of ozone water and a standard cleaning solution (SC-1).

20. The method according to claim 19, wherein the liquid cleaning solution is ozone water having a concentration of ozone of 1–100 PPM, and each of said steps of wet cleaning is carried out while the temperature of the ozone water is in a range of 0–30° C.

21. The method according to claim 15, wherein each of said steps of dry cleaning comprises maintaining the hydrogen in a plasma state and the fluorine-based gas at a pressure of 0.01–10 Torr and at a temperature of −25–50° C., and said annealing is performed at a temperature of 100–500° C.

* * * * *